(12) United States Patent
Sunachi et al.

(10) Patent No.: US 7,211,834 B2
(45) Date of Patent: May 1, 2007

(54) SEMICONDUCTOR LIGHT-EMITTING ELEMENT AND MANUFACTURING METHOD THEREOF

(75) Inventors: Naoya Sunachi, Tokyo (JP); Hiroyuki Matsuoka, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 10/812,036

(22) Filed: Mar. 30, 2004

(65) Prior Publication Data
US 2006/0011934 A1    Jan. 19, 2006

(30) Foreign Application Priority Data
Oct. 3, 2003   (JP)   ............... 2003-345709

(51) Int. Cl.
*H01L 29/22* (2006.01)
(52) U.S. Cl. .......................................... 257/99; 257/98
(58) Field of Classification Search ................. 257/99, 257/98, 91, E33.062, E33.074
See application file for complete search history.

(56) References Cited

U.S. PATENT DOCUMENTS 5,040,044 A * 8/1991 Noguchi et al. ............ 257/103
5,779,924 A * 7/1998 Krames et al. ............... 216/24
6,277,665 B1 * 8/2001 Ma et al. ........................ 438/46
7,037,738 B2 * 5/2006 Sugiyama et al. ............ 438/29

FOREIGN PATENT DOCUMENTS

JP         7-162037    *  6/1995
JP        A 10-200162      7/1998

* cited by examiner

*Primary Examiner*—Sara Crane
(74) *Attorney, Agent, or Firm*—Oliff & Berridge, PLC

(57) ABSTRACT

An improvement in electrode reliability is realized by preventing over-etching on a peripheral lower portion of an electrode while maintaining the flow of steps of roughening a surface after forming the electrode on a semiconductor substrate. After a P-side electrode 4 is formed on a main surface 3a of a semiconductor substrate 3, a surface of the P-side electrode 4 is selectively covered with a protective film 12, after the semiconductor substrate 3 is cut into chips, the surface is roughened from above the protective film 12, the main surface 3a around the P-side electrode 4 and a side surface are roughened with a non-chemical treatment region 10 which is a non-roughened surface region being left in a peripheral portion of the P-side electrode 4 covered with the protective film 12, and thereafter the protective film 12 is removed.

2 Claims, 3 Drawing Sheets

FIG.1
A
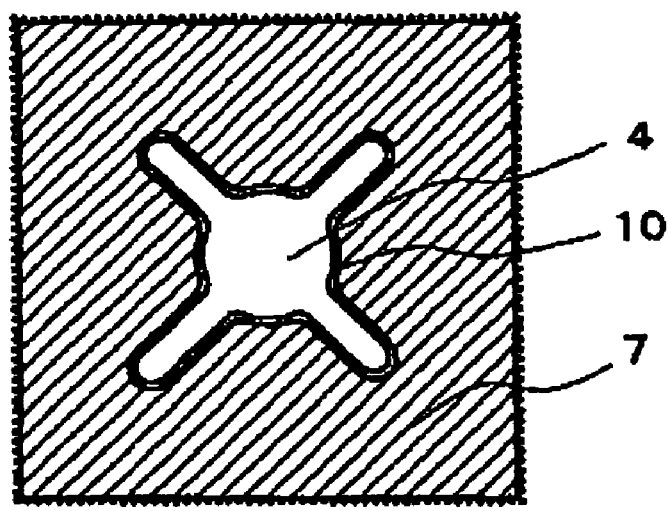
B
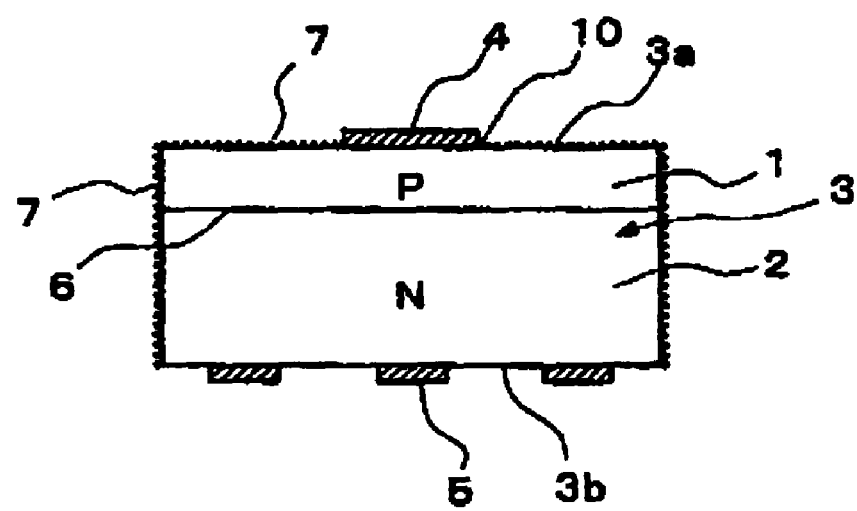

SEMICONDUCTOR LIGHT-EMITTING ELEMENT AND MANUFACTURING METHOD THEREOF

BACKGROUND OF THE INVENTION

1. Field of the Invention

The present invention relates to a semiconductor light-emitting element in which a roughened surface region which suppresses internal reflection of light is formed on a main ice of a semiconductor substrate from which light is taken out, and a manufacturing method thereof.

2. Description of the Related Art

The brightness is increased by forming a roughened surface which suppresses internal reflection of light on a main surface of a semiconductor light emitting element from which light is taken out (See Patent Document 1, for example).

FIG. 3 shows an example thereof. This semiconductor light-emitting element (light-emitting diode) includes an AlGaAs semiconductor substrate 3, for example, composed of a P-type semiconductor region 1 and an N-type semiconductor region 2, a P-side electrode 4, and at least one of N-side electrodes 5. A PN junction 6 at an interface between the P-type semiconductor region 1 and the N-type semiconductor region 2 extends parallel to one and the other main surfaces 3a and 3b of the semiconductor substrate 3.

The P-side electrode 4 is placed in one main surface (upper surface) 3a of the semiconductor substrate 3, in a central portion thereof for example, and connected to the P-type semiconductor region 1. At least one of the N-side electrodes 5 is formed in a lattice pattern or in a dot pattern, for example, and connected to the other main surface (lower surface) 3b of the semiconductor substrate 3, that is, to the N-type semiconductor region 2. The formation of at least one of the N-side electrodes 5 in a lattice pattern or in a dot pattern as described above makes it possible to efficiently reflect light, which is emitted from the PN junction 6 and heads for the lower surface, toward the upper surface in portions where no N-side electrode 5 is provided.

Light is taken out from the semiconductor light-emitting element in FIG. 3 in a direction toward the upper surface, and light emitted upward from the PN junction 6 out of the light to be taken out is taken out from a region of the upper surface of the semiconductor substrate 3 where the P-side electrode 4 is not formed. In this semiconductor light-emitting element, the region of the upper surface of the semiconductor substrate 3 from which the light is taken out is a roughened surface (minutely uneven surface, roughened surface region) 7. This roughened surface 7 is provided so as to reduce the probability of total reflection of the light emitted from the PN junction 6 to take out the light to the outside satisfactorily, thereby realizing higher brightness. This roughened surface 7 is formed by selectively forming the P-side electrode 4 almost at the center of the upper surface of the semiconductor substrate 3 and thereafter subjecting the upper surface of the semiconductor substrate 3 to etching (chemical treatment) or the like.

Incidentally, when such a semiconductor light-emitting element is formed as described above there sometimes occurs so-called over-etching (also called side-etching) in which etching progresses as far as a peripheral lower portion of the P-side electrode 4 as shown in FIG. 4 at the time of etching for forming the roughened surface after the electrode is formed. If such over-etching occurs, adhesion of a peripheral portion of the P-side electrode 4 to the semiconductor substrate 3 lowers, involving the problem such that the electrode peels off due to stress when resin molding or wire bonding is performed on the semiconductor light-emitting element, which has an influence upon the reliability of the electrode.

Hence, in an art described in Patent Document 1, as shown in FIG. 5, in order to inhibit the lowering of the adhesion of the peripheral portion of the P-side electrode 4 to the semiconductor substrate 3, a mirror surface 8 and the roughened surface 7 are formed in advance on the upper surface of the P-type semiconductor region 1 of the semiconductor light-emitting element, and when the P-side electrode 4 is formed on the mirror surface 8, the peripheral portion of the P-side electrode 4 is formed so as to partially cover the roughened surface 7, thus increasing the adhesion of the peripheral portion of the P-side electrode 4 to the semiconductor substrate 3 is realized.

(Patent Document 1)
Japanese Patent Laid-open No. Hei 10-200162

In the art described in Patent Document 1, electrode adhesion is increased by previously performing a surface roughening treatment to increase the brightness of the semiconductor light-emitting element in a range extending to a peripheral lower portion of a place where the electrode is formed and thereafter forming the P-side electrode 4 in such a manner that the peripheral portion thereof covers the roughened surface 7. Namely, the surface roughening treatment is performed in a stage prior to an electrode forming process. Therefore, a conventional order of steps in which the surface roughening treatment is performed after the electrode forming process needs to be greatly changed, which causes a problem that the burden of changing the steps is large.

SUMMARY OF THE INVENTION

In view of the aforementioned circumstances, an object of the present invention is to provide a semiconductor light-emitting element capable of realizing an improvement in electrode reliability by preventing over-etching on a peripheral lower portion of an electrode by a chemical treatment while maintaining the flow of steps in which a surface roughening treatment by the chemical treatment is performed after the electrode is formed on a semiconductor substrate, and a manufacturing method thereof.

A semiconductor light-emitting element of the invention in claim 1 is a semiconductor light-emitting element in which electrodes are formed on a main surface from which light is taken out and on a main surface on an opposite side thereto in a semiconductor substrate, and a roughened surface region whose surface is roughened is formed on at least the main surface around the electrode formed on the main surface from which the light is taken out, wherein a non-roughened surface region which prevents surface roughening is secured in a peripheral portion of the electrode formed on the main surface from which the light is taken out or in peripheral portions of the electrode formed on the main surface from which the light is taken out and the electrode formed on the main surface on the opposite side thereto.

A semiconductor light-emitting element of the invention in claim 2 is a semiconductor light emitting element comprising: a semiconductor substrate including a PN junction formed by a first semiconductor region having one conductive type of a P type and an N type and a second semiconductor region having the other conductive type; a first electrode formed on a main surface in the first semiconductor region of the semiconductor substrate; and a second electrode armed on a main surface in the second semiconductor region of the semiconductor substrate, wherein a main surface side in the first semiconductor region is conducted so that light is taken out therefrom, and a roughened surface region whose surface is roughened is formed on at least the main surface around the first electrode, and a non-roughened surface region which prevents surface roughening is secured in a peripheral portion of the first electrode or in peripheral portions of the first electrode and the second electrode.

A manufacturing method of a semiconductor light-emitting element of the invention in claim 3 is a manufacturing method of a semiconductor light-emitting element in which an electrode is formed on a main surface of a semiconductor substrate from which light is taken out and a roughened surface region whose surface is roughened is formed on at least the main surface around the electrode formed on the main surface from which the light is taken out, the manufacturing method of the semiconductor light-emitting element comprising: forming electrodes on the main surface of the semiconductor substrate from which the light is taken out and a main surface on an opposite side thereto; covering selectively a surface of the electrode on the main surface from which the light is taken out or a surface of the electrode on the main surface on the opposite side to the electrode on the main surface from which the light is taken out with a protective film; roughening at least the main surface around the electrode on the main surface from which the light is taken out with a non-roughened surface region being left in a peripheral portion of the electrode covered with the protective film by performing a surface roughening treatment from above the protective film; and removing the protective film which covers the surface of the electrode.

A manufacturing method of a semiconductor light-emitting element of the invention in claim 4 is a manufacturing method of a semiconductor light-emitting element which includes: a semiconductor substrate including a PN junction formed by a first semiconductor region having one conductive type of a P type and a N type and a second semiconductor region having the other conductive type; a first electrode formed on a main surface in the first semiconductor region of the semiconductor substrate; and a second electrode formed on a main surface in the second semiconductor region of the semiconductor substrate, the first semiconductor region being constructed so that light is taken out to a main surface side, and a roughened surface region whose surface is roughened being formed on at least the main surface around the first electrode, the manufacturing method of the semiconductor light-emitting element comprising: forming the first and second electrodes on one and the other main surface of the semiconductor substrate; covering selectively a surface of the first electrode or surfaces of the first and second electrodes with a protective film; roughening at least the main surface around the first electrode with a non-roughened surface region being left in a peripheral portion of the electrode covered with the protective film by performing a surface roughening treatment from above the protective film; and removing the protective film which covers the surface of the first electrode or the surfaces of the first and second electrodes.

The invention in claim 5 is the manufacturing method of the semiconductor light-emitting element according to claim 4, comprising covering the surface of the electrode by protective film, followed by a dicing step that cuts the semiconductor substrate into chips, and thereafter the surface roughening step, thus roughening an upper surface of a chip having the first electrode and a side thereof having no electrode at the same time.

According to a semiconductor light-emitting element of the present invention, a non-roughened surface region which prevents surface roughening by a surface roughening treatment including a chemical treatment is secured in a peripheral portion of an electrode. Therefore, over-etching on a peripheral lower portion of the electrode can be prevented, thereby improving the reliability of the electrode. Moreover, since the non-roughened surface region is secured in the peripheral portion of the electrode, the surface roughening treatment including the chemical treatment can be performed after the electrode is formed on the semiconductor substrate. Therefore, it is unnecessary to greatly change the conventional flow of steps, and hence the burden of changing the steps is small.

A manufacturing method of a semiconductor light-emitting element of the present invention comprises, forming an electrode, followed by covering selectively a surface of the electrode with a protective film, thereafter roughening the surface from above the protective film, and then removing the protective film. Accordingly over-etching on a peripheral lower portion of the electrode due to the surface roughening treatment including the chemical treatment can be prevented, thus improving the reliability of the electrode. Moreover, since the surface roughening treatment including the chemical treatment is performed after the electrode is formed, it is unnecessary to greatly change the conventional flow of steps, and hence the burden of changing the steps is small.

BRIEF DESCRIPTION OF THE DRAWINGS

FIG. 1A is a plan view showing the structure of a semiconductor light-emitting element according to an embodiment of the present invention, and FIG. 1B is a cross-sectional side view thereof;

DETAILED DESCRIPTION OF THE PREFERRED EMBODIMENT(S)

Figure 2:
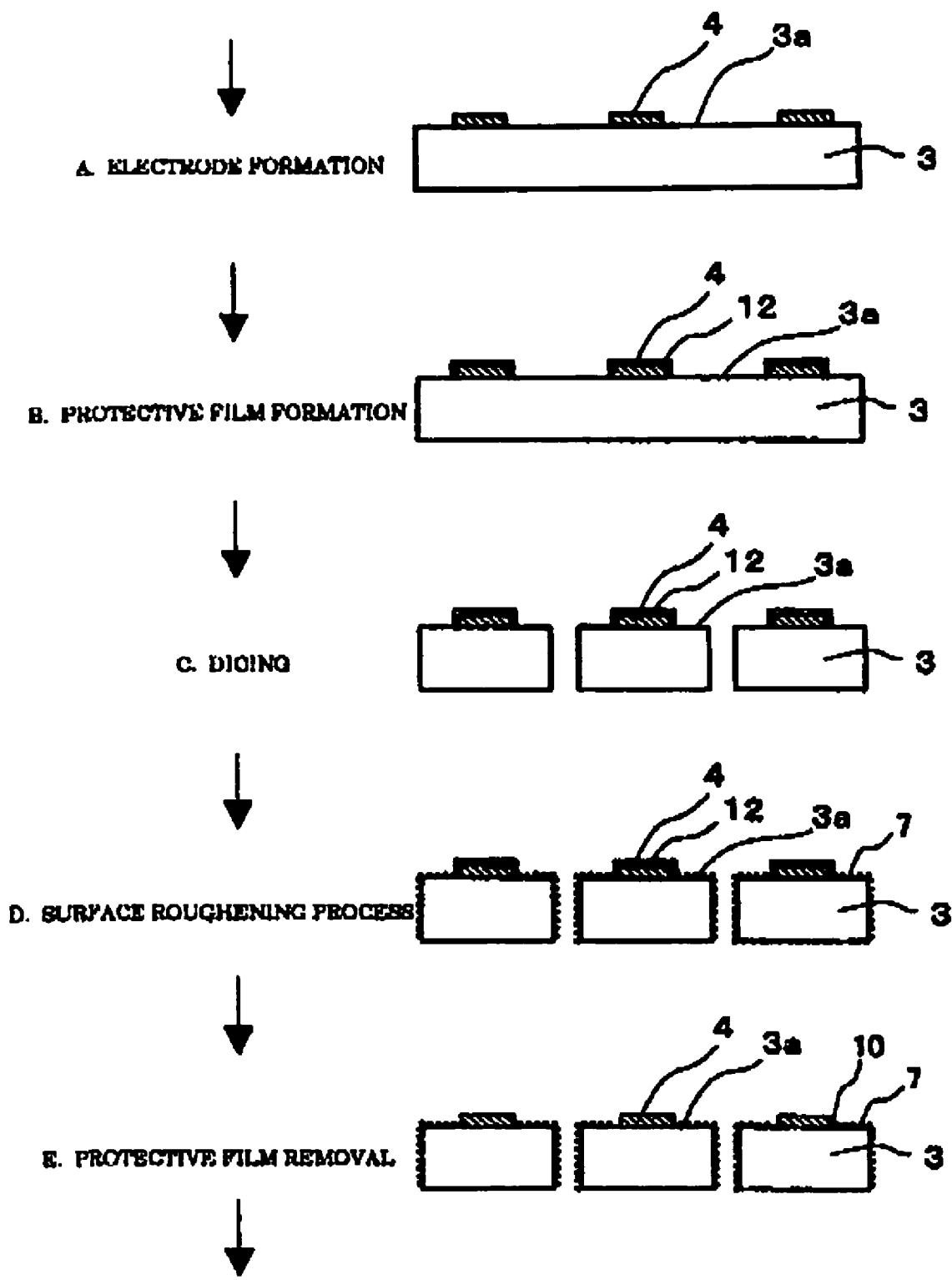
FIG. 2A to FIG. 2E are explanatory views showing steps of a manufacturing method of the semiconductor light-emitting element according to the embodiment of the present invention.
Figure 3:
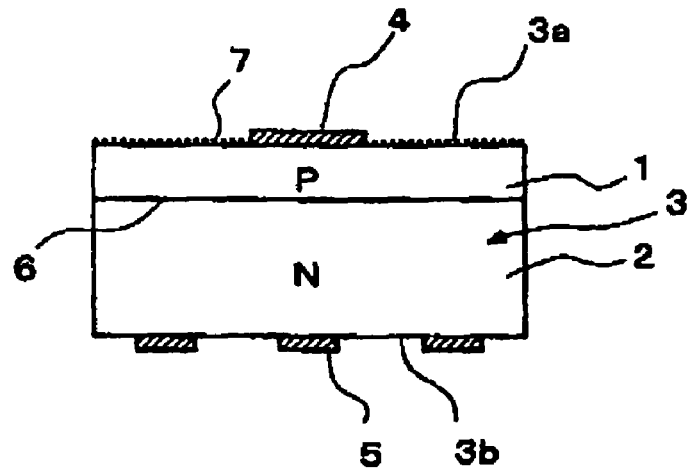
FIG. 3 is a cross-sectional side view showing an example of a conventional semiconductor light-emitting element.
Figure 4:
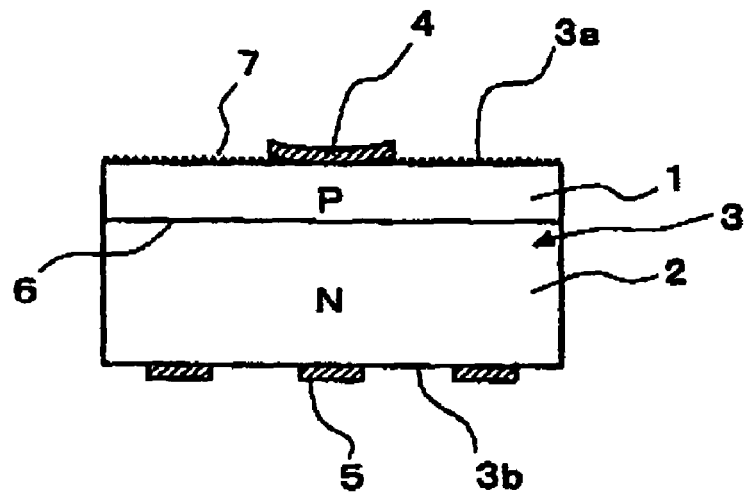
FIG. 4 is a cross-sectional side view explaining a problem in the conventional semiconductor light-emitting element.
Figure 5:
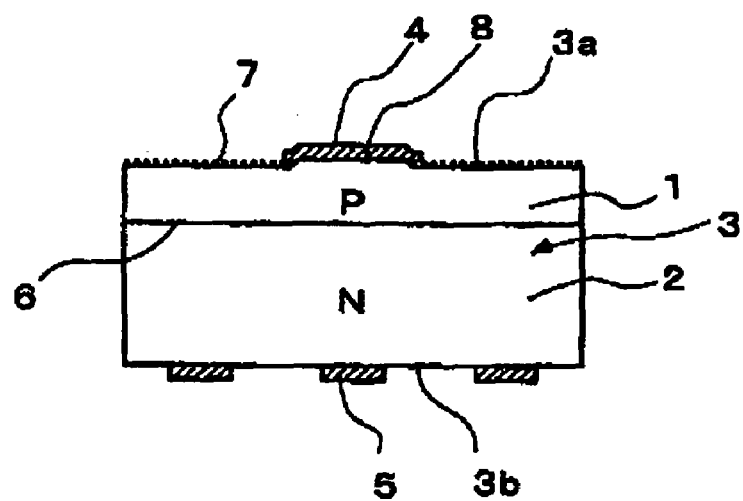
FIG. 5 is a cross-sectional side view showing another example of the conventional semiconductor light-emitting element.

An embodiment of the present invention will be described below with reference to the drawings.

It should be mentioned that this embodiment will be explained with a case where a chemical treatment is used as a surface roughening treatment as an example.

FIG. 1A is a plan view of a semiconductor light-emitting element according to the embodiment, FIG. 1B is a cross-sectional side view thereof, and FIG. 2A to FIG. 2E are views showing steps of a manufacturing method of the semiconductor light-emitting element according to the embodiment.

As shown in FIG. 1A and FIG. 1B, this semiconductor light-emitting element includes a semiconductor substrate (for example, AlGaAs) 3 having a PN junction 6 formed by a P-type semiconductor region (first semiconductor region) 1 and an N-type semiconductor region (second semiconductor region) 2, a P-side electrode 4, and at least one of N-side electrodes 5. The PN junction 6 at an interface between the P-type semiconductor region 1 and the N-type semiconductor region 2 extends parallel to one and the other main surfaces 3a and 3b of the semiconductor substrate 3.

The P-side electrode 4 is placed in the main surface 3a, in a central portion thereof for example, on the P-type semiconductor region 1 side of the semiconductor substrate 3, and at least one of the N-side electrodes 5 is placed in a lattice pattern or in a dot pattern, for example, on the main surface 3b on the N-type semiconductor region 2 side of the semiconductor substrate 3. Light is taken out from this semiconductor light-emitting element in a direction toward the upper surface in FIG. 1B, and light emitted upward from the PN junction 6 is taken out from a region of the upper surface of the semiconductor substrate 3 where the P-side electrode 4 is not formed.

In order to take out the light to the outside satisfactorily to increase brightness, the surface of the region of the semiconductor substrate 3 from which the light is taken out is roughened by etching (chemical treatment). This roughened surface (roughened surface region) 7 performs a function of reducing the probability of total reflection of the light emitted from the PN junction 6, it is formed by etching after the P-side electrode 4 is formed on the semiconductor substrate 3, and a non-chemical treatment region 10 which is a non-roughened surface region to prevent surface roughening by etching is secured in a peripheral portion of the P-side electrode 4.

Next, a manufacturing method will be explained with reference to FIG. 2A to FIG. 2E.

The aforementioned semiconductor light-emitting element is obtained by advancing a process in the following order of steps.

FIG. 2A: The P-side electrode 4 is formed on the one main surface 3a of the semiconductor substrate 3 before dicing (an electrode forming step).

FIG. 2B: A surface of the P-side electrode 4 is selectively covered with a protective film 12 by a positive resist (a protective film forming step).

FIG. 2C: The semiconductor substrate 3 is cut into chips by dicing (a dicing step).

FIG. 2D: By performing etching from above the protective film 12, for example, using $HNO_3$ as an etching solution, at least an upper surface of the chip with the P-side electrode 4, and a side surface with no electrode, as desired, are roughened simultaneously with the nonchemical treatment region 10 being left in the peripheral portion of the P-side electrode 4 covered with the protective film 12 (a surface roughening step). A numeral 7 denotes a roughened surface.

FIG. 2E: The protective film 12 covering the surface of the P-side electrode 4 is removed by exposure and resist development (a protective film removing step).

Incidentally, the N-side electrode may be formed after the aforementioned last step or may be formed in any step during the process. If the N-side electrode is formed in a step prior to the aforementioned surface roughening step, it is also preferable to form the protective film over the N-side electrode similarly to that over P-side electrode. The reason is that this structure avoids undesired etching around the N-side electrode caused by the etching solution such as $HNO_3$ that reaches the N-side electrode along the chip.

By forming the semiconductor light-emitting element through the aforementioned steps, over-etching on a peripheral lower portion of the P-side electrode 4 can be prevented, thus improving the reliability of the electrode. Moreover, the surface roughening treatment by etching is performed after the P-side electrode 4 is formed, whereby it is unnecessary to greatly change the conventional flow of steps, and hence the burden of changing the steps is small.

Next, results of a study of the difference among a conventional product "without electrode protection and with surface roughening treatment", a product corresponding to the present invention "with electrode protection and with surface roughening treatment", and a comparative product "without surface roughening treatment" are shown in Table 1. In Table 1, ten semiconductor light-emitting elements according to each of the conventional product, the product corresponding to the present invention, and the comparative product are taken out from each of lots A to C, driving voltages (Vfm) at Ifp=200 mA are measured, and a mean value thereof is found. Note that $\sigma$ is a standard deviation thereof.

Here, peeling of the electrode due to insufficient adhesion to the semiconductor substrate can be considered as an increase in the driving voltage (Vfm). From Table 1, a difference of approximately 0.1 V in Vfm value between the product corresponding to the present invention which is subjected to the surface roughening treatment after the electrode is protected by the protective film and the conventional product which is subjected to the surface roughening treatment without the electrode being protected by the protective film can be seen. Moreover, a difference of approximately 0.01 V to 0.02 V in Vfm value between the product corresponding to the present invention and the comparative product without the surface roughening treatment can be seen. Accordingly, it turns out that in the product corresponding to the present invention, as compared with the conventional product, elective peeling is greatly improved, and that the level of this improvement is a match for the comparative product which is not subjected to the surface roughening treatment.

TABLE 1

| | lot symbol | | |
|---|---|---|---|
| | A | B | C |
| conventional product (without electrode protection) (with surface roughening treatment) | 1.90 V ($\sigma$ = 0.04) | 1.92 V ($\sigma$ = 0.06) | 2.01 V ($\sigma$ = 0.03) |
| product corresponding to present invention (with electrode protection) (with surface roughening treatment) | 1.81 V ($\sigma$ = 0.03) | 1.88 V ($\sigma$ = 0.06) | 1.91 V ($\sigma$ = 0.03) |
| comparative product (without surface roughening treatment) | 1.79 V ($\sigma$ = 0.03) | 1.86 V ($\sigma$ = 0.05) | 1.90 V ($\sigma$ = 0.03) |

This embodiment is explained above with a constitution in which the P-type semiconductor region is taken as the first semiconductor region and the N-type semiconductor region is taken as the second semiconductor region, and light is taken out from the P-type semiconductor region side as an example. The present invention is also applicable to a semiconductor light-emitting element having a constitution in which the P-type semiconductor region and the N-type semiconductor region are interchanged, the N-type semiconductor region side is taken as the first semiconductor region from which light is taken out, and the P-type semiconductor region side is taken as the second semiconductor region.

Further, this embodiment is explained with a case where the chemical treatment is used as the surface roughening treatment as an example. But, the present invention is not limited to this example, and it is appropriately applicable to cases where the surface roughening treatment is performed by a physico-chemical treatment and a physical process such as spattering etching and dry etching.

What is claimed is:

1. A semiconductor light-emitting element in which electrodes are formed on a main surface from which light is taken out and on a main surface on an opposite side thereto in a semiconductor substrate, and a roughened surface region whose surface is roughened is formed on at least the main surface around the electrode formed on the main surface from which the light is taken out, wherein
   a non-roughened surface region obtained by preventing surface roughening is secured in a peripheral portion of the electrode formed on the main surface from which the light is taken out or in peripheral portions of the electrode formed on the main surface from which the light is taken out and the electrode formed on the main surface on the opposite side thereto.

2. A semiconductor light-emitting element, comprising:
   a semiconductor substrate including a PN junction formed by a first semiconductor region having one conductive type of a P type and an N type and a second semiconductor region having the other conductive type;
   a first electrode formed on a main surface in the first semiconductor region of said semiconductor substrate; and
   a second electrode formed on a main surface in the second semiconductor region of said semiconductor substrate,
   wherein a main surface side in the first semiconductor region is constructed so that light is taken out therefrom, and a roughened surface region whose surface is roughened is formed on at least the main surface around said first electrode,
   and a non-roughened surface region obtained by preventing surface roughening is secured in a peripheral portion of said first electrode or in peripheral portions of said first electrode and said second electrode.

* * * * *